(12) United States Patent
Lee

(10) Patent No.: US 7,015,122 B2
(45) Date of Patent: Mar. 21, 2006

(54) METHOD OF FORMING POLYSILICON THIN FILM TRANSISTOR

(75) Inventor: Seok-Woo Lee, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 85 days.

(21) Appl. No.: 10/695,897

(22) Filed: Oct. 30, 2003

(65) Prior Publication Data
US 2004/0087064 A1    May 6, 2004

(30) Foreign Application Priority Data
Oct. 31, 2002    (KR) .................. 10-2002-0067120

(51) Int. Cl.
H01L 21/20    (2006.01)
H01L 21/36    (2006.01)

(52) U.S. Cl. ............... 438/486; 438/166; 438/479; 438/487; 438/491

(58) Field of Classification Search ............ 438/96, 438/97, 149, 150, 151, 166, 479, 482, 486, 438/487, 491
See application file for complete search history.

(56) References Cited

U.S. PATENT DOCUMENTS 5,534,716 A * 7/1996 Takemura ............... 257/72
6,168,980 B1 * 1/2001 Yamazaki et al. ......... 438/162
6,479,331 B1 * 11/2002 Takemura ............... 438/153
6,569,716 B1 * 5/2003 Suzuki ................. 438/149
6,569,720 B1 * 5/2003 Kunii ................... 438/151

FOREIGN PATENT DOCUMENTS

JP    11-074536    3/1999
KR    2001-0052812    6/2001

OTHER PUBLICATIONS

S. Matsuda, et al. "Novel Corner Rounding Process For Shallow Trench Isolation Utilizing MSTS (Micro-Structure Transformation of Silicon)." *IEDM Technical Digest*. pp. 137-140, 1998.

* cited by examiner

Primary Examiner—Maria F. Guerrero
(74) Attorney, Agent, or Firm—McKenna Long & Aldridge LLP

(57) ABSTRACT

A method of forming a polysilicon thin film transistor is disclosed in the present invention. The method includes forming a buffer layer on a transparent substrate, forming an amorphous silicon layer on the buffer layer, crystallizing the amorphous silicon layer into a polysilicon layer using a sequential lateral solidification (SLS) method, patterning the polysilicon layer to form a polysilicon active layer, performing a rapid thermal annealing (RTA) process to the polysilicon active layer under a $H_2$ atmosphere, performing a rapid thermal oxidation (RTO) process to form a silicon-oxidized layer on the polysilicon active layer after the RTA process, and forming a metal layer over the transparent substrate to cover the silicon-oxidized layer.

12 Claims, 9 Drawing Sheets

METHOD OF FORMING POLYSILICON THIN FILM TRANSISTOR

This application claims the benefit of the Korean Patent Application No. P2002-067120 filed on Oct. 31, 2002, which is hereby incorporated by reference.

BACKGROUND OF THE INVENTION

1. Field of the Invention

The present invention relates to a liquid crystal display device, and more particularly, to a method of forming polysilicon thin film transistors. Although the present invention is suitable for a wide scope of applications, it is particularly suitable for improving characteristics of the thin film transistors (TFTs) and stabilizing the fabrication process.

2. Discussion of the Related Art

In general, since flat panel display devices are thin, light weight, and have a low power consumption, they have been used for displays of portable devices. Among the various types of flat panel display devices, liquid crystal display (LCD) devices are widely used for wall-mounted TVs, laptop computers, and desktop computer monitors because of their superiority in resolution, color image display, and display quality.

Optical anisotropy and polarization characteristics of liquid crystal molecules are utilized to generate desirable images. Liquid crystal molecules have specific alignment directions that result from their own peculiar characteristics. The specific alignment can be modified by electric fields that are applied upon the liquid crystal molecules. In other words, the electric fields applied upon the liquid crystal molecules can change the alignment of the liquid crystal molecules. Due to the optical anisotropy, the incident light is refracted according to the alignment of the liquid crystal molecules.

Specifically, the LCD devices include upper and lower substrates having electrodes that are spaced apart and face into each other, and a liquid crystal material is interposed therebetween. Accordingly, when a voltage is applied to the liquid crystal material through the electrodes of each substrate, an alignment direction of the liquid crystal molecules is changed in accordance with the applied voltage, thereby displaying images. By controlling the applied voltage, the LCD device provides various transmittances to display image data.

The lower substrate of the LCD device includes a plurality of thin film transistors as switching devices. Each thin film transistor includes an active layer formed of amorphous silicon (a-Si:H). That is because an amorphous silicon film can be easily formed on a large-sized inexpensive glass substrate.

However, for the purpose of operating the thin film transistor having such an amorphous silicon active layer, the required operating circuits include complementary metal-oxide-semiconductor (CMOS) devices. Further, the CMOS device requires a single crystal silicon as an active layer instead of amorphous silicon. Accordingly, the liquid crystal display includes the thin film transistors each having the amorphous silicon active layer, and is operated by large scale integration circuits each having the single crystal silicon active layer. Furthermore, the large scale integration is connected to the liquid crystal display for operation by way of a tape automated bonding (TAB) method. However, the operating circuits, such as large scale integration circuits, are very expensive, thereby causing an increase in the fabrication cost of the liquid crystal display.

Recently, a thin film transistor adopting polysilicon as an active layer has been researched and developed. The liquid crystal display having the polysilicon active layer enables the thin film transistors and the operating circuits to consist on the same substrate. Herein, the process of connecting the operating circuits to the thin film transistors is not required during the fabrication process of the liquid crystal display. Furthermore, since the polysilicon active layer has carrier mobility 100 to 200 times faster than that of the amorphous silicon active layer, the thin film transistors and the operating circuits employing the polysilicon active layer can allow the liquid crystal display to have a much faster response time. Additionally, the thin film transistors and the operating circuits having the polysilicon active layer are stable and safe against variations in light and temperature conditions.

The polysilicon may be formed by as-deposition or plasma enhanced chemical vapor deposition (PECVD). Further, after forming the amorphous silicon using low pressure chemical vapor deposition (LPCVD), the amorphous silicon can be converted into the polycrystalline silicon by crystallization. Methods for crystallizing the amorphous silicon layer include a solid phase crystallization (SPC) method, an metal induced crystallization (MIC) method, a laser-annealing method, and a sequential lateral solidification (SLS) method.

The polycrystalline silicon film formed by one of the above-mentioned methods is composed of crystal grains having grain boundaries. The larger the grains and the more regular the grain boundaries are, the better the field effect mobility and the carrier mobility become. Thus, a silicon crystallization method that produces large grains, ideally a single crystal, would be advantageous.

Among the above-mentioned crystallization methods, the SLS crystallization is based on the fact that silicon grains tend to grow laterally from the interface between liquid and solid silicon. In the SLS method, amorphous silicon is crystallized using a laser beam having a magnitude and a relative motion that melts amorphous silicon such that the melted silicon forms laterally grown silicon grains upon recrystallization. The SLS crystallization method is disclosed in detail by Robert S. Sposilli, M. A. Crowder, and James S. Im, Mat. Res. Soc. Symp. Proc. Vol. 452, pp. 956–957, 1997.

The SLS crystallization of the amorphous silicon film will be explained as follows. FIGS. 1A to 1C are schematic views showing an amorphous silicon film being crystallized using the related art SLS method. The length of the lateral growth of a grain is determined by energy density of a laser beam, by the temperature of a substrate, and by the thickness of an amorphous silicon film (as well as other factors). The maximum lateral grain growth should be considered to be dependent upon optimized conditions. In the SLS method shown in FIGS. 1A to 1C, the width of a slit of a laser beam mask is less than twice of the maximum lateral grain growth. Furthermore, before carrying out the SLS crystallization, a buffer layer of silicon oxide ($SiO_2$) is first formed on a transparent substrate, and then an amorphous silicon film is formed on the buffer layer.

FIG. 1A shows the initial step of crystallizing an amorphous silicon film 20 using a first laser beam irradiation. A laser beam first passes through a mask deposited on the amorphous silicon film 20 and irradiates the portion A1 of the amorphous silicon film on the buffer layer. The laser beam irradiates and melts the portion A1 of the amorphous silicon film 20. The energy density of the laser beam should be sufficient to induce complete melting of the amorphous silicon film 20. More specifically, the portion A1 of the amorphous silicon film 20 that is irradiated by the laser beam is completely melted through to the buffer layer.

Still referring to FIG. 1A, after complete melting, the liquid phase silicon begins to crystallize at the interfaces S of the solid phase amorphous silicon and the liquid phase silicon. Crystallization occurs such that grains grow laterally. Thus, as shown in FIG. 1A, the lateral grain growth of grains 22 proceeds from the un-melted regions to the fully melted regions. The lateral growth stops either when the grains grown from interfaces collide near the middle section B1 of the melted silicon region, or when the polycrystalline silicon particles are formed in the middle section B1 as the melted silicon region solidifies sufficiently to generate solidification nuclei.

Since the width of the slit of the mask is less than twice of the maximum lateral growth of the grains 22, the width of the melted silicon region A1 is also less than twice the size of the maximum lateral growth length of the grains. Therefore, the lateral grain growth stops when the grains grown from interfaces collide near the middle section B1 of the melted silicon region.

As discussed above, the grain boundaries in directionally solidified silicon tend to be formed perpendicular to the interfaces S between the solid phase amorphous silicon and the liquid phase silicon. Thus, as a result of the first laser beam irradiation, a plurality of crystallized regions A1 are formed and the grain-colliding region B1 is also formed.

As previously mentioned, the length of lateral grain growth attained by a single laser irradiation depends on the laser energy density, the temperature of the substrate, and the thickness of the amorphous silicon film. Typically, the lateral grain growth ranges from 1 to 1.5 micrometers.

FIG. 1B illustrates crystallizing the amorphous silicon film 22 of FIG. 1A using a second laser beam irradiation. After the first laser beam irradiation, the substrate having the partially crystallized silicon film 20 moves in a direction along the lateral grain growth of the grains 22 (shown in FIG. 1A), (i.e., in the X direction) by a distance that is no more than half A1-2 of the initially crystallized region A1. Then, a second laser beam irradiation is conducted. The region A2 irradiated by the second laser beam are melted and crystallized in the same way as described above. The silicon grains 22 produced by the first laser beam irradiation serve as seeds for the second crystallization. Thus, the lateral grain growth proceeds in the second melted region A2. Silicon grains 23 formed by the second laser beam irradiation and silicon grains 22a continuously growing from the previously formed silicon grains 22 meet together at the middle section B2 of the region A2.

Accordingly, in the same manner of the foregoing step of melting and crystallizing, the amorphous silicon film 20 is crystallized to form a plurality of large grains 24 as shown in FIG. 1C. In a third laser beam irradiation, the region A3 irradiated by the third laser beam are melted and crystallized in the same way as described above. The third irradiated region A3 includes more than half A2-2 of the previously crystallized region A2.

By repeating the above-mentioned melting and crystallizing the amorphous silicon film, the polysilicon film having large grains can be formed. However, since the SLS crystallization method makes the grains grow from both right and left sides, and the growing grains collide in the middle section B, as shown in FIGS. 1A to 1C, a plurality of laser beam shots are required and a protuberance occurs in the middle section B. The protuberance is produced by the collision of the oppositely growing grains and cause an uneven surface of the crystallized silicon film.

The aforementioned SLS crystallization method can be adopted for forming both the driving circuits and the switching devices. The crystalline silicon layer formed by the SLS method, as described above, can be used as an active layer of a thin film transistor, among other uses, such as driving devices and switching devices.

When the resolution of a liquid crystal display device becomes greater, a pad pitch of the signal lines and the scanning lines is reduced. Thus, it becomes more difficult to bond a tape carrier package (TCP) to the pads. However, the SLS grown polycrystalline silicon can be used for driving integrated circuits (ICs) and can be formed on the same substrate as the thin film transistors. Instead of the TCP method, the driving ICs can be directly installed in the liquid crystal panel using a thin film transistor having polysilicon active layers. Such formation of driving ICs on a substrate decreases production costs and can ease fabrication difficulties.

FIG. 2 is a schematic view of a liquid crystal display panel including a data driving circuit 134a and a gate driving circuit 134b adopting crystalline active layers fabricated by the aforementioned related art method.

As shown in FIG. 2, a liquid crystal panel 130 includes a display region 132 and a driving region 135. A plurality of switching devices (i.e., thin film transistors (TFTs)) are formed in the display region 132. A data driving circuit 134a and a gate driving circuit 134b are also disposed in the driving region 135. The driving circuits 134a and 134b include a plurality of complementary metal oxide semiconductor (CMOS) devices. The CMOS device is constituted by both an N-type thin film transistor and a P-type thin film transistor and operated as an inverter. Since the CMOS device consumes a small quantity of electric power, it is used as a driving device constituting the data and gate driving circuits 134a and 134b.

FIGS. 3 and 4 are cross-sectional views showing a switching device and CMOS transistors, respectively, having polysilicon active layers according to the related art.

As shown in FIGS. 3 and 4, a CMOS device C is comprised of an N-type TFT C1 and a P-type TFT C2, which are driven by an inverter relative to each other in a normal totem pole fashion. Since a CMOS device C consumes little electric power, it is suitable for a driving circuit. Such CMOS devices require fast operating characteristics that are satisfied by active layers comprised of polysilicon. Further, since the TFT T of FIG. 3 is formed of polycrystalline silicon fabricated according to the method shown in FIGS. 1A to 1C, the TFT T has high electron mobility, thereby improving display quality.

The fabrication process for the CMOS device C and the thin film transistor T will be explained as follows with reference to FIGS. 3 and 4. Herein, for the purpose of describing the related art CMOS device, an N-type thin film transistor T is considered.

First, a buffer layer 152 is formed on a transparent substrate 150. An amorphous silicon (a-Si:H) layer including hydrogen is formed on the buffer layer 152. The amorphous silicon is then dehydrogenated. Subsequently, the amorphous silicon layer is crystallized using one of the aforementioned methods (first or second embodiments), thereby forming a polycrystalline silicon layer.

The polycrystalline silicon layer is then patterned to form first to third active layers 154, 156, and 158 shown in FIGS. 3 and 4. The first polycrystalline silicon active layer 154 is divided into an active channel region 154a and two doping regions 154b that are disposed on both sides of the active channel region 154a. Furthermore, the second polycrystalline silicon active layer 156 is divided into an active channel region 156a and two doping regions 156b, and the third polycrystalline silicon active layer 158 is divided into an active layer 158a and two doping regions 158b. A first insulation layer 160 is formed on the buffer layer 152 so as to cover the polycrystalline silicon active layers 154, 156, and 158. A plurality of gate electrodes 162, 164, and 166 are then formed on the first insulation layer 160, particularly over the active channel regions 154a, 156a, and 158a. The first insulating layer 160 is removed except for portions underneath the gate electrodes 162, 164, and 166.

Thereafter, the doping regions 154b, 156b, and 158b are doped while using the gate electrodes 162, 164, and 166 as masks. The doping regions 154b and 156b are doped by $n^+$ ions, whereas the doping regions 158b are doped by $p^+$ ions. Therefore, the transistors T and C1 become N-type transistors, and the transistor C2 becomes a P-type transistor.

Thereafter, a second insulation layer 168 is formed on the first insulation layer 160 to cover the gate electrodes 162, 164, and 166. The second insulation layer 168 is then patterned to form contact holes exposing impurity-doped regions 154b, 156b, and 158b. After patterning the second insulation layer 168, a metal layer is formed on the second insulation layer 168. The metal layer is then patterned to form source electrodes 170a, 172a, and 174a and drain electrodes 170b, 172b, and 174b. As shown in FIGS. 3 and 4, the source electrodes 170a, 172a, and 174a contact the impurity-doped regions 154b, 156b, and 158b, respectively, on the right side of the transistors. The drain electrodes 170b, 172b, and 174b also contact the impurity-doped regions 154b, 156b, and 158b, respectively, on the left side of the transistors. Therefore, the thin film transistor T and the CMOS device C are formed. A passivation layer 176 is then formed on the second insulation layer 168 to cover all transistors T, C1, and C2. The passivation layer 176 is then patterned to expose a portion of the drain electrode 170b of the thin film transistor T. Thus, a pixel electrode 178 formed on the passivation layer 176 contacts the drain electrode 170b of the thin film transistor T.

The switching devices and operating devices shown in FIGS. 3 and 4 are fabricated using the polycrystalline silicon that is crystallized by the SLS crystallization method shown in FIGS. 1A to 1C, so that the polysilicon active layers 154, 156, and 158 have a problem of surface roughness. If the polysilicon active layers 154, 156, and 158 include the protuberances caused by the collision of the grain growth, an electric field crowding occurs in the protuberances and then becomes worse to beak a gate insulator. Namely, the electric field crowding decreases a gate insulator breakdown voltage.

FIG. 5 is a plane view illustrating a storage capacitor formed on a gate line according to the related art, and FIG. 6 is a cross-sectional view taken along line VI—VI of FIG. 5.

A storage capacitor 210 is formed on a gate line 205. At this time, a polysilicon layer 200 is formed underneath the gate line 205. When the gate line 205 overlaps the polysilicon layer 200, a protuberance may be disposed at the edge E of the polysilicon active layer 200, as shown in FIG. 6. At this time, a large step of the polysilicon active layer 200 causes the breakdown of a gate insulator 202 and, further, causes the breakdown of the gate line 205.

SUMMARY OF THE INVENTION

Accordingly, the present invention is directed to a method of forming a polysilicon thin film transistor that substantially obviates one or more of problems due to limitations and disadvantages of the related art.

Another object of the present invention is to provide a method of forming a polysilicon thin film transistor, which has improved operating characteristics.

A further object of the present invention is to provide a method of forming a polysilicon thin film transistor, which prevents breakdowns of a gate insulator and a gate line in a liquid crystal display device.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a polysilicon thin film transistor includes forming a buffer layer on a transparent substrate, forming an amorphous silicon layer on the buffer layer, crystallizing the amorphous silicon layer into a polysilicon layer using a sequential lateral solidification (SLS) method, patterning the polysilicon layer to form a polysilicon active layer, performing a rapid thermal annealing (RTA) process to the polysilicon active layer under a $H_2$ atmosphere, performing a rapid thermal oxidation (RTO) process to form a silicon-oxidized layer on the polysilicon active layer after the RTA process, and forming a metal layer over the transparent substrate to cover the silicon-oxidized layer.

Moreover, the method further includes patterning the metal layer to form a gate electrode over the polysilicon active layer, doping n-type ions to form lightly doped drain (LDD) regions in the polysilicon active layer on both sides of the gate electrode, and doping p-type ions to ohmic contact regions outside the LDD regions, forming an interlayer insulator over the transparent substrate to cover the gate electrode, patterning the interlayer insulator to form first and second contact holes exposing the ohmic contact regions, forming source and drain electrodes on the interlayer insulator, the source and drain electrodes contacting the ohmic contact regions, respectively, through the first and second contact holes, forming a passivation layer on the interlayer insulation to cover the source and drain electrodes, wherein the passivation layer has a drain contact hole that exposes a portion of the drain electrode, and forming a pixel electrode on the passivation layer, the pixel electrode contacting the drain electrode through the drain contact hole.

In the method of forming a polysilicon thin film transistor, the patterning the metal layer includes patterning the silicon-oxidized layer into the same shape as the gate electrode. The interlayer insulator is formed of one of silicon oxide and silicon nitride. The RTA and RTO processes are conducted at a temperature in the range of about 500 to 1000 degrees Celsius for less than 60 minutes. The RTO process is conducted under an oxygen-based atmosphere, which includes at least one of $O_2$, $N_2O$, and NO. In the present invention, the method further includes dehydrogenating the amorphous silicon layer before crystallizing the amorphous silicon layer. The metal layer is selected from the group consisting of aluminum (Al), aluminum alloy (Al-alloy), and molybdenum (Mo).

Furthermore, in the present invention, the crystallizing the amorphous silicon layer generates a plurality of protuberances of the polysilicon layer. And, the RTA process blunts and flattens the protuberances of the polysilicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

FIGS. 7A to 7G are cross-sectional views illustrating process steps for fabricating a thin film transistor having a polysilicon active layer according to the present invention.

Figure 1A:
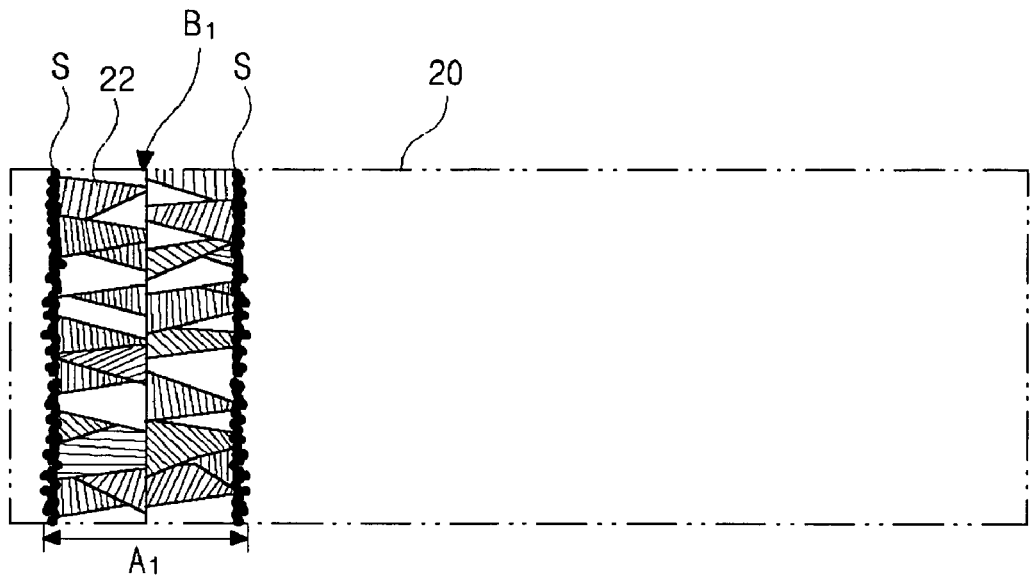
FIGS. 1A to 1C are schematic views showing crystallizing an amorphous silicon film according to the related art sequential lateral solidification (SLS) method.
Figure 1B:
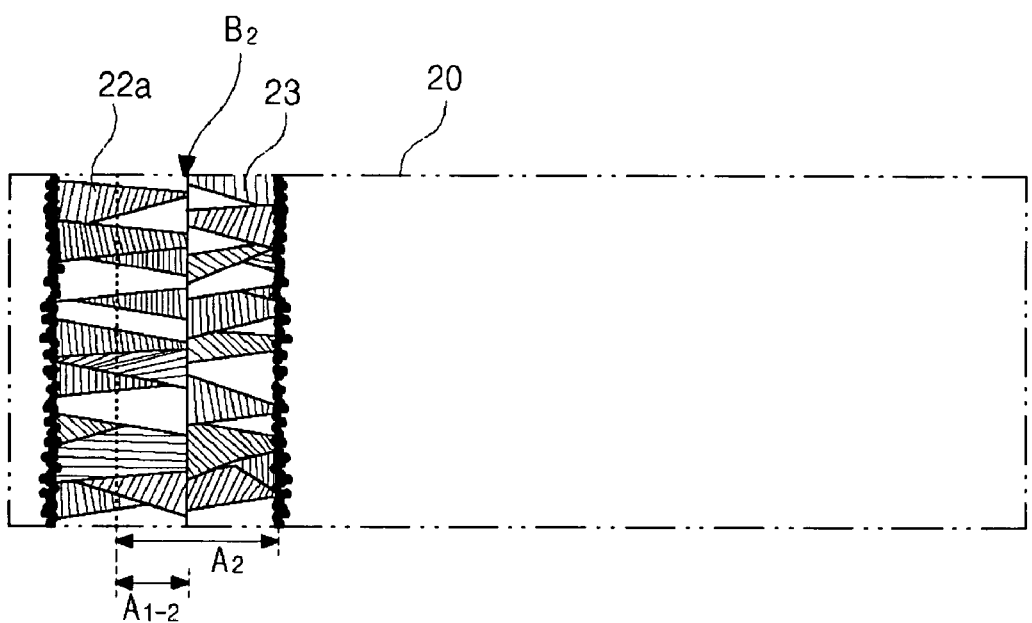
Figure 1C:
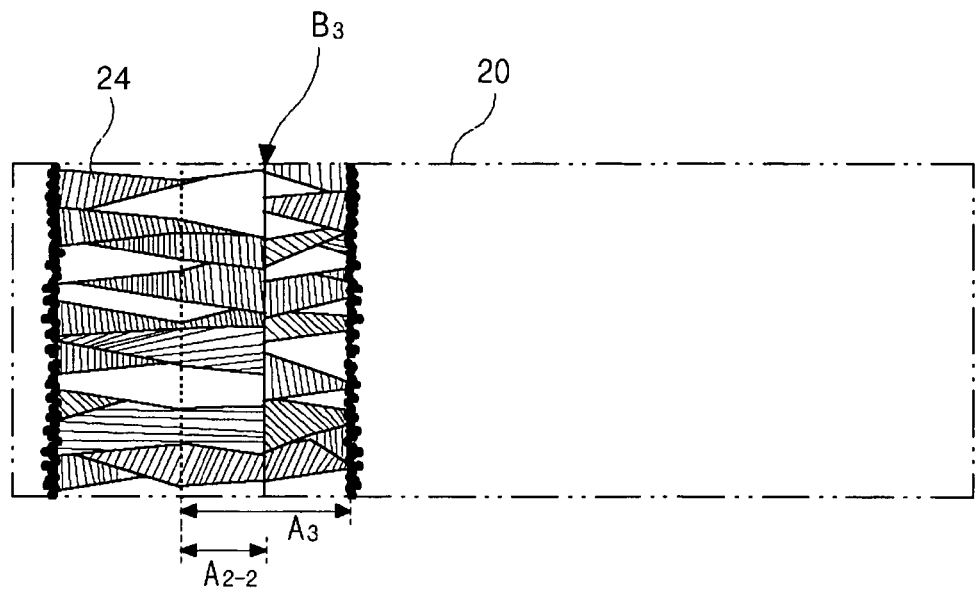
Figure 2:
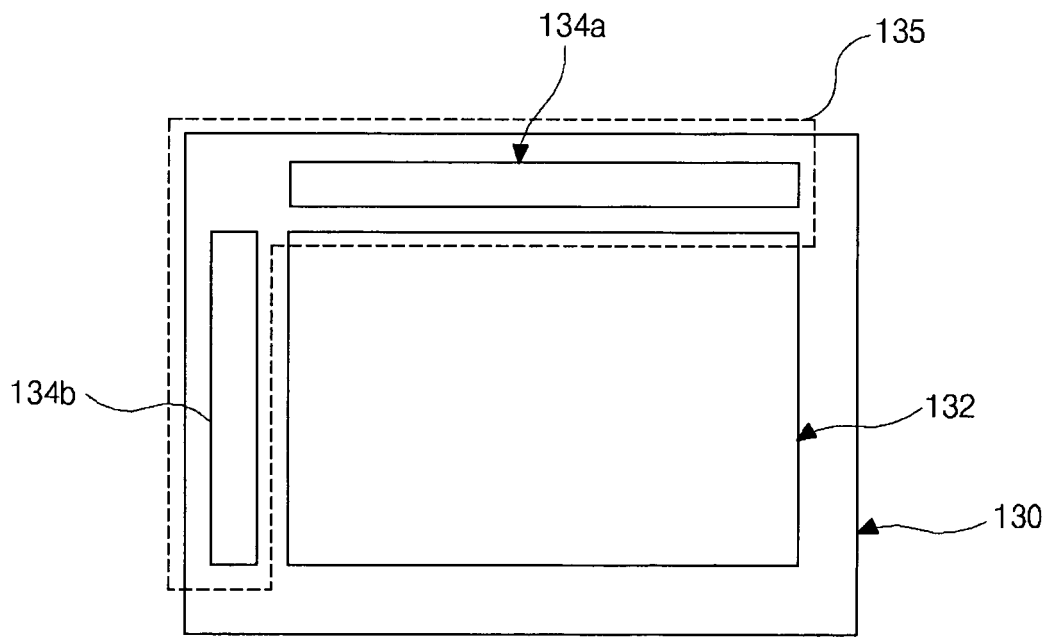
FIG. 2 is a schematic view of a liquid crystal display panel including a data driving circuit and a gate driving circuit adopting polysilicon active layers fabricated according to the related art SLS method.
Figure 3:
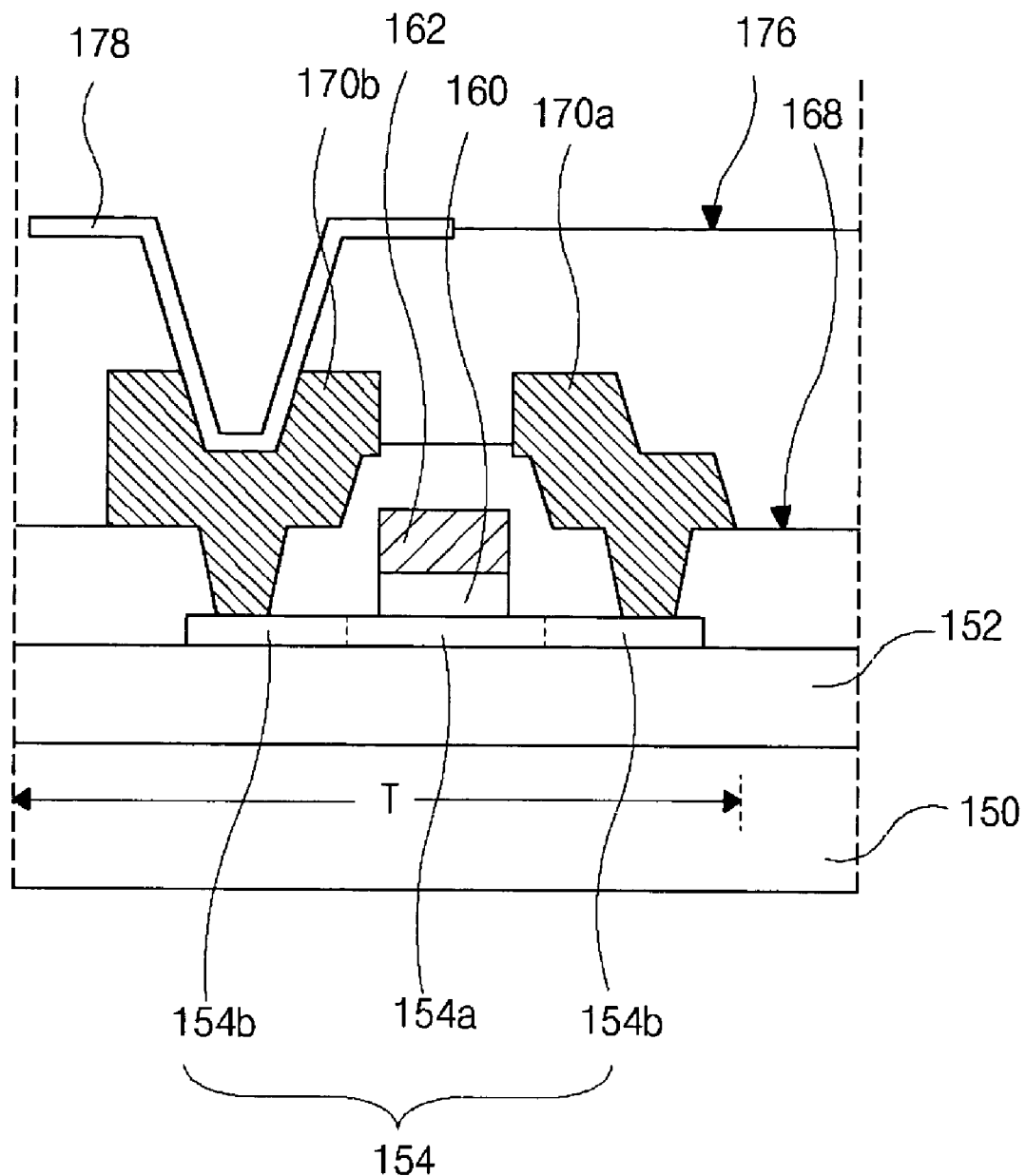
FIGS. 3 and 4 are cross-sectional views showing a switching device and CMOS transistors, respectively, having polysilicon active layers according to the related art.
Figure 4:
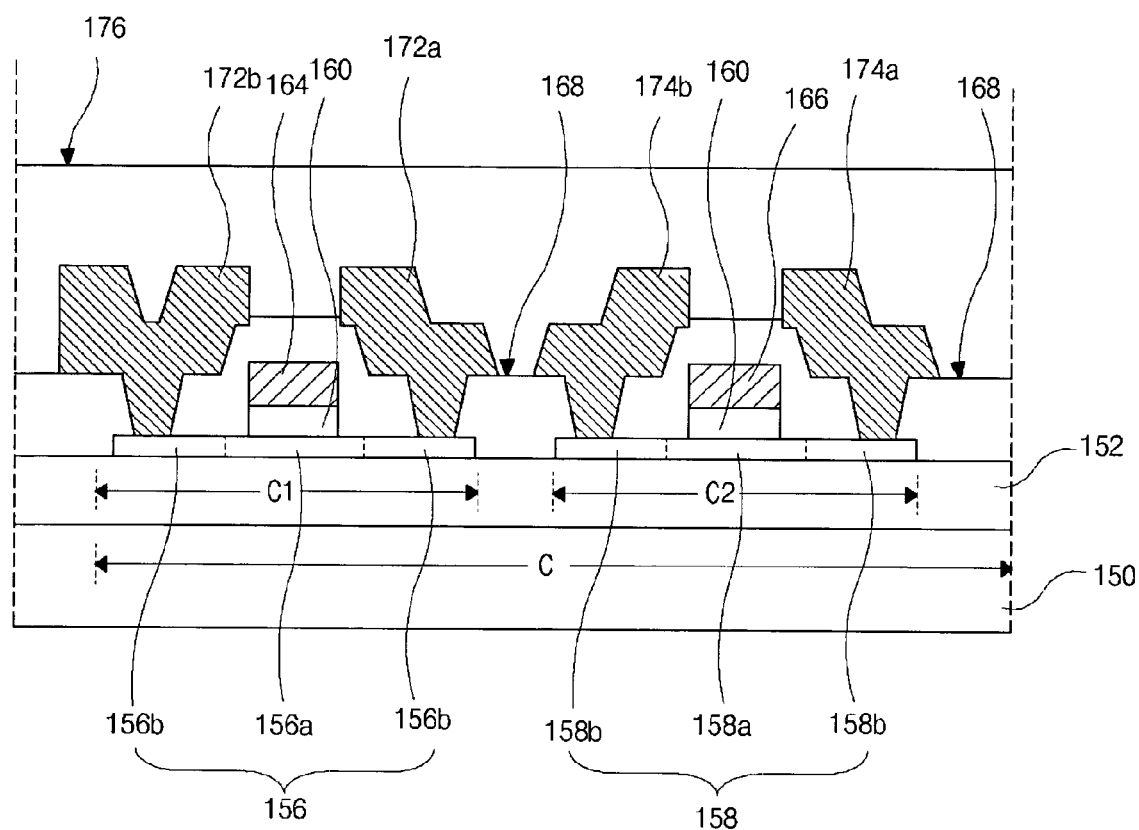
Figure 5:
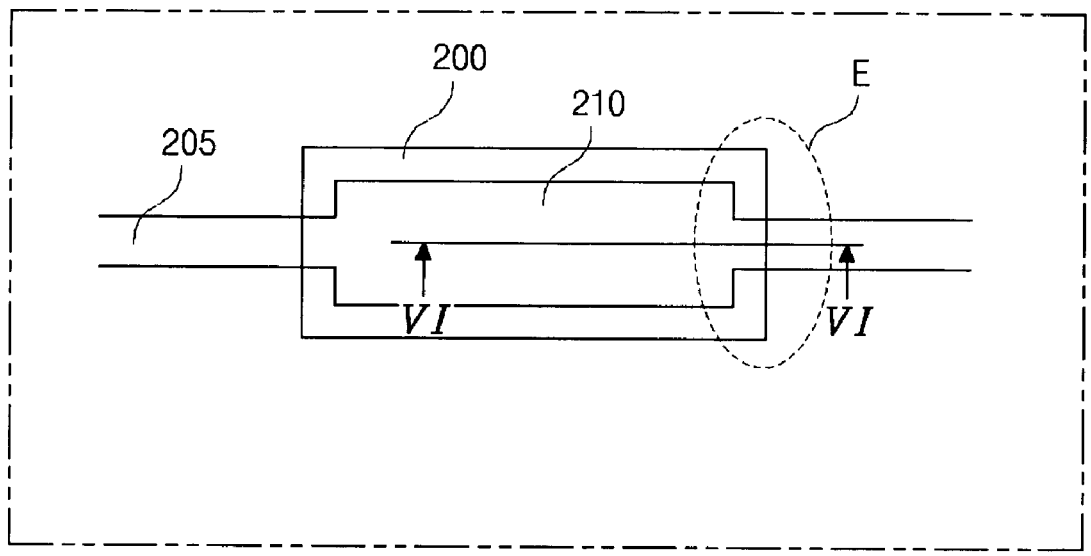
FIG. 5 is a plane view illustrating a storage capacitor formed on a gate line according to the related art.
Figure 6:
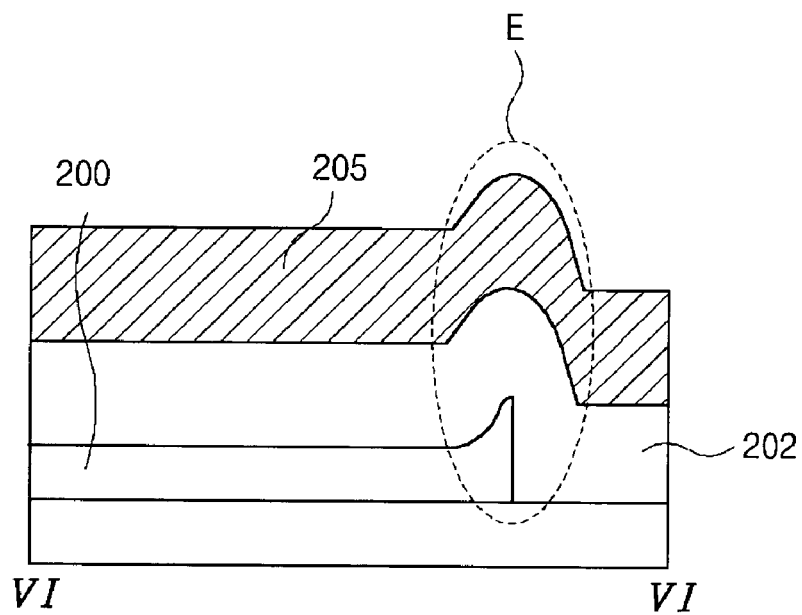
FIG. 6 is a cross-sectional view taken along line VI—VI of FIG. 5.
Figure 7A:
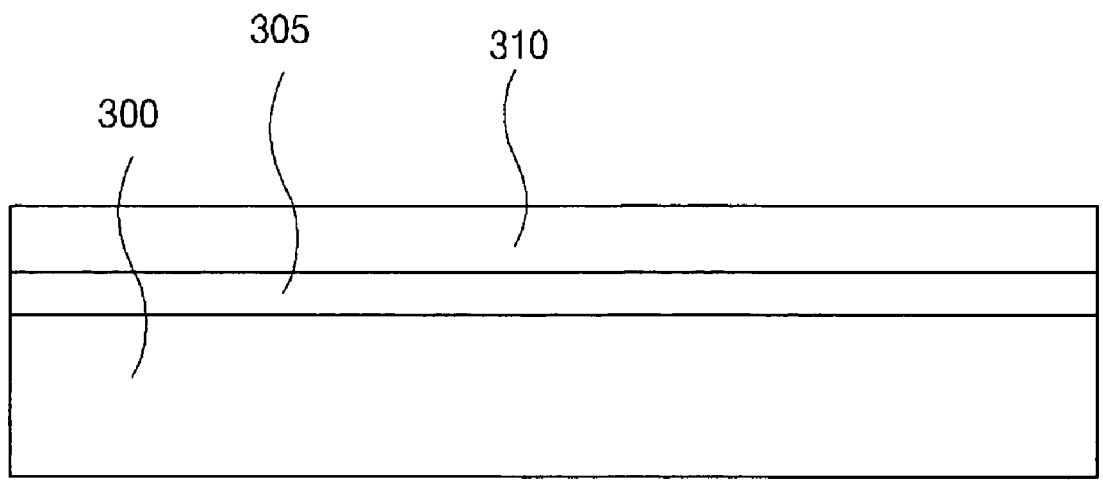
FIGS. 7A to 7G are cross-sectional views illustrating process steps for fabricating a thin film transistor having a polysilicon active layer according to the present invention.

FIG. 7A shows a step of forming a buffer layer 305 and an amorphous silicon layer 310. Silicon oxide ($SiO_2$) is formed on the entire surface of a transparent substrate 300 so that the buffer layer 305 is formed on the transparent substrate 300. Thereafter, amorphous silicon is formed on the entire surface of the buffer layer 305 so as to form the amorphous silicon layer 310. In a later step, the amorphous silicon layer 310 will be crystallized. In crystallizing the amorphous silicon layer 310, since heat is applied to the transparent substrate 300, alkali ions, such as potassium ions ($K^+$) and/or natrium ions ($Na^+$), may be diffused from the transparent substrate 300 to the silicon layer 310 and the diffused ions may deteriorate the quality of silicon layer 310. Therefore, the buffer layer 305 is interposed between the transparent substrate 300 and the amorphous silicon layer 310 so as to prevent the alkali ion diffusion. Furthermore, after forming the amorphous silicon layer 310 on the buffer layer 305, a dehydrogenation process is performed to remove hydrogen from the amorphous silicon layer 310.

Figure 7B:
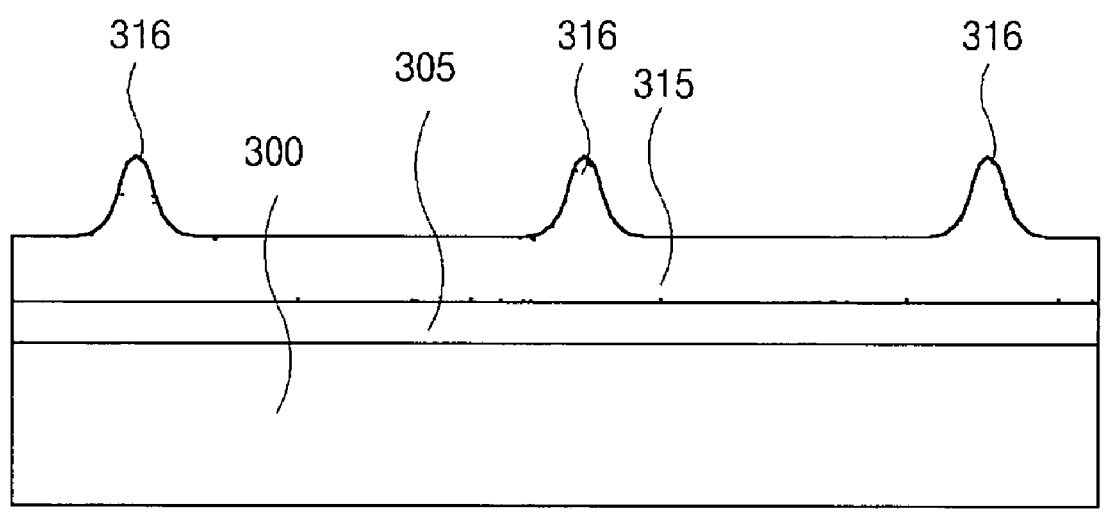

Referring to FIG. 7B, the amorphous silicon layer 310 of FIG. 7A is crystallized by a sequential lateral solidification (SLS) method using laser beams, thereby forming a polysilicon layer 315. When forming the polysilicon layer 315, a plurality of protuberances 316 are formed on the surface of the polysilicon layer 315. Each protuberance 316 may exist in the border of growing grains.

Figure 7C:
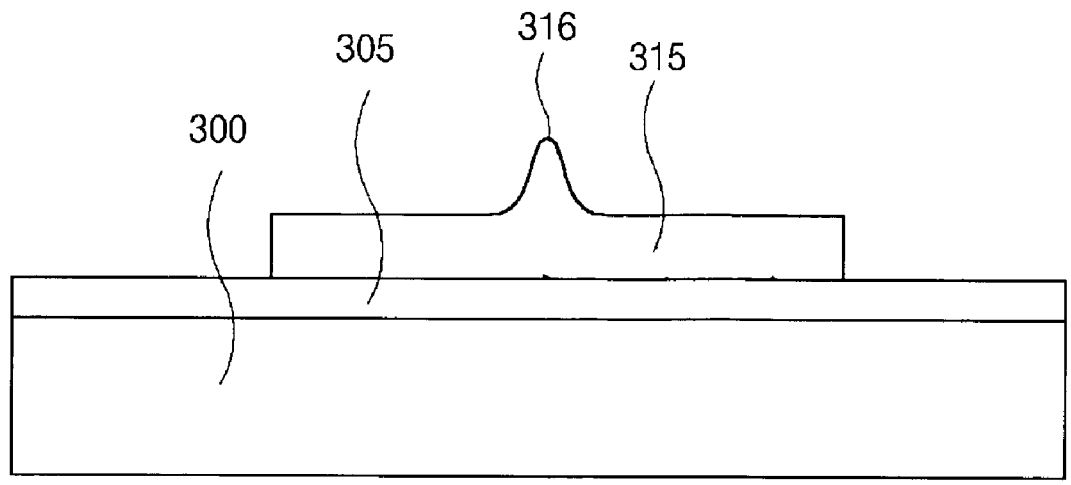

In FIG. 7C, the polysilicon layer 315 is patterned by using a mask process. When patterning the polysilicon layer 315, a photoresist is formed on the polysilicon layer 315, and then an exposure process is performed using a mask having a desired pattern. After the exposure process, the photoresist is developed, and then the polysilicon layer 315 underlying the developed photoresist is etched into a desired pattern. Thereafter, the residual photoresist pattern is stripped.

Figure 7D:
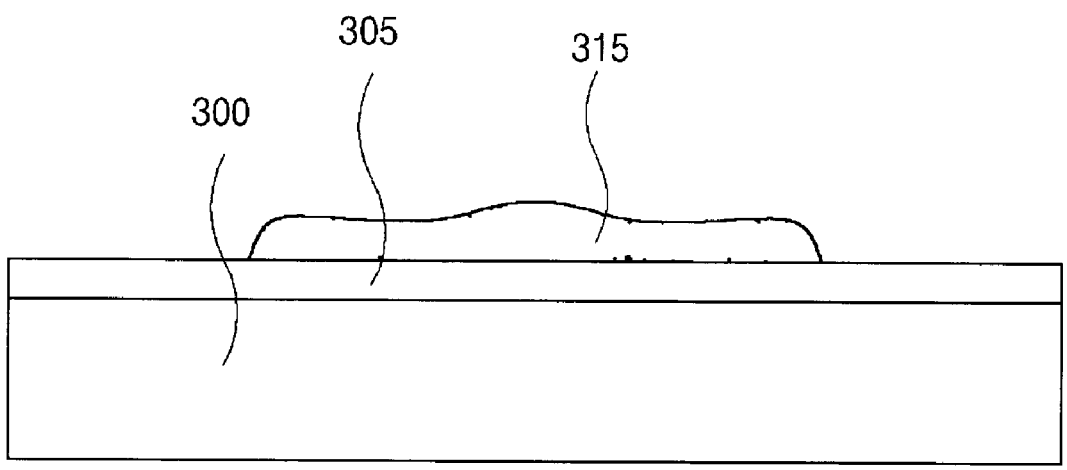

Subsequently, in FIG. 7D, a rapid thermal annealing (RTA) process is conducted on the transparent substrate 300 having the patterned polysilicon layer 315 under a $H_2$ atmosphere in a vacuum chamber. The RTA process blunts and flattens the protuberance 316, as shown in FIG. 7D. A temperature for the RTA process ranges from 500 to 1000 degrees Celsius, and the RTA process lasts for about 1 to 60 minutes.

The RTA process performing at the temperature of 500 to 1000 degrees Celsius under the $H_2$ atmosphere anneals the patterned polysilicon layer 315, and thus, the protuberances from the surface of the patterned polysilicon 315 is blunted and flattened. This is referred to as a silicon migration phenomenon that occurs at a high temperature condition under the $H_2$ atmosphere. As the temperature becomes higher and the pressure becomes lower, the silicon migration phenomenon readily occurs. During the RTA process, silicon moves in a direction that reduces a silicon surface potential energy so that the protuberances 316 are lowered to the level of the surface of the polysilicon layer 315. Namely, the protuberances 316 existing in the border of the growing grains are removed by the RTA process.

Figure 7E:
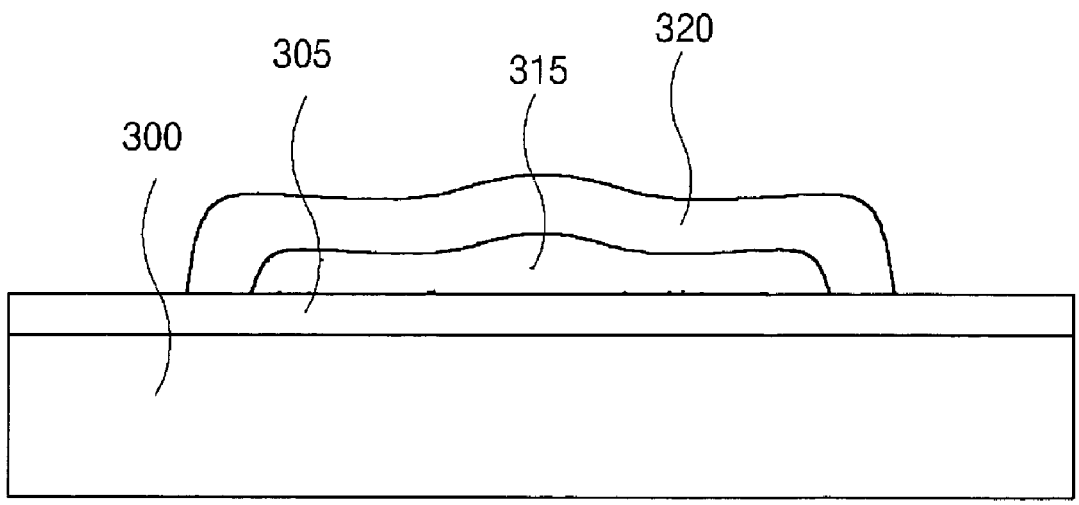

After the RTA process, the chamber containing the annealed polysilicon layer 315 changes the atmosphere from the $H_2$ atmosphere to an oxygen-based atmosphere. For example, $O_2$, $N_2O$, NO, and other similar gases substitute $H_2$. Then, a rapid thermal oxidation (RTO) is conducted in the chamber containing the above-mentioned oxygen-based gases for less than 60 minutes at a temperature of 500 to 1000 degrees Celsius. Therefore, a silicon-oxidized layer 320 is formed on the surface of the annealed polysilicon layer 315, as shown in FIG. 7E. A thickness of the silicon-oxidized layer 320 depends on the process temperature and time inside the chamber. The silicon-oxidized layer 320 then becomes a gate insulator.

Figure 7F:
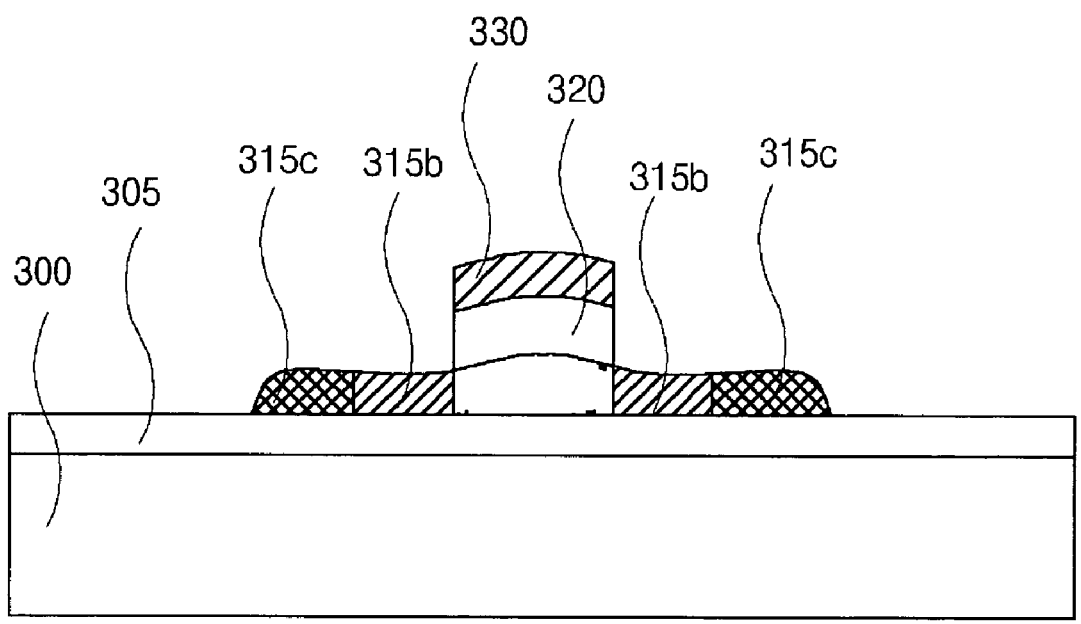

Subsequently, in FIG. 7F, a gate metal layer, for example, aluminum (Al), aluminum alloy (Al-alloy) or molybdenum (Mo), is formed over the entire surface of the transparent substrate 300 to cover the gate insulator 320, and then patterned to form a gate electrode 330 over the polysilicon layer 315. When patterning the gate metal to form the gate electrode 330, the gate insulator 320 is also patterned to have the same shape as the gate electrode 330, thereby exposing side portions 315b and 315c of the polysilicon layer. Thereafter, n-type ions are doped on the polysilicon layer 315 to form lightly doped drain (LDD) regions 315b, respectively, on both sides of the gate electrode 330. Using a mask process, n+ type ions are also doped on the polysilicon layer 315 so that n-type ohmic contact regions 315c are formed outside the LDD regions 315b, respectively. Although not shown in FIG. 7F, p+ type ions are doped on a polysilicon layer for a P-type thin film transistor of the CMOS device, thereby forming a p-type ohmic contact layer.

Figure 7G:
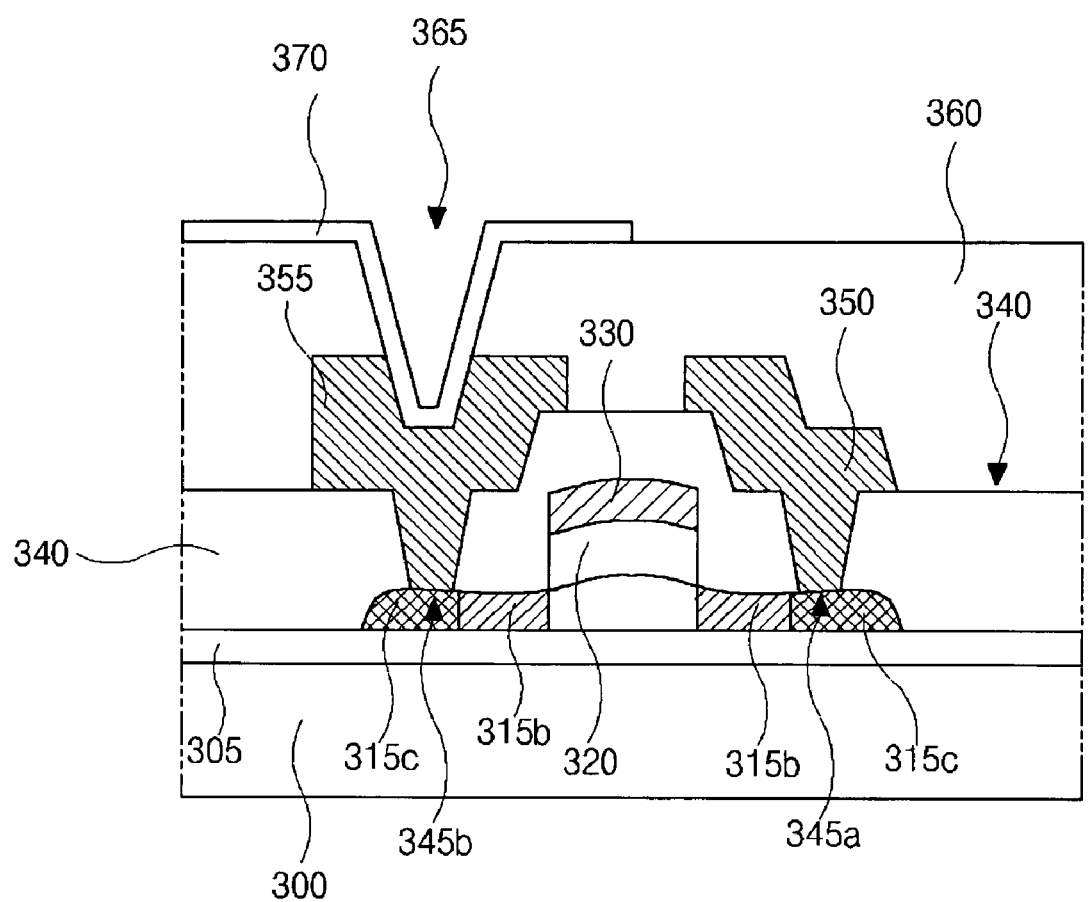

Thereafter, as shown in FIG. 7G, an interlayer insulator 340 is formed over the entire surface of the transparent substrate 300 to cover the gate electrode 330, the gate insulator 320, and the doped polysilicon layer 315. The interlayer insulator 340 is formed of an inorganic insulator, such as silicon oxide or silicon nitride. Thereafter, the interlayer insulator 340 is patterned to form the first contact hole 345a and the second contact hole 345b, which respectively expose the ohmic contact regions 315c. Then, a source electrode 350 and a drain electrode 355 are formed on the interlayer insulator 340 to contact the ohmic contact regions 315c, respectively, through the first and second contact holes 345a and 345b.

After forming the source and drain electrodes 350 and 355, silicon nitride is deposited on the entire surface of the transparent substrate 300 to cover the interlayer insulator 340 and the source and drain electrodes 350 and 355, thereby forming a passivation layer 360. The passivation layer 360 is patterned to form a drain contact hole 365 that exposes a portion of the drain electrode 355. A transparent conductive material, such as indium tin oxide or indium zinc oxide, is formed on the passivation layer 360, and then patterned to form a pixel electrode 370 contacting the drain electrode 355 through the drain contact hole 365. Therefore, the thin film transistor having the polysilicon active layer and an array substrate having such thin film transistor are complete according to the present invention.

Accordingly, in the present invention, the RTA process under the $H_2$ atmosphere at a high temperature condition improves the surface condition of the polysilicon active layer, so that the electric field crowding causing the breakdown of layers (i.e., the gate insulator) is prevented. Furthermore, the gate line overlapping the polysilicon layer in the storage portion is not broken because the polysilicon layer of the present invention does not have any protuberances on its surface.

It will be apparent to those skilled in the art that various modifications and variations can be made in the method of forming the polysilicon thin film transistor of the present invention without departing from the spirit or scope of the inventions. Thus, it is intended that the present invention covers the modifications and variations of this invention provided they come within the scope of the appended claims and their equivalents.

What is claimed is:

1. A method of forming a thin film transistor, comprising:
    forming a buffer layer on a transparent substrate;
    forming an amorphous silicon layer on the buffer layer;
    crystallizing the amorphous silicon layer into a polysilicon layer using a sequential lateral solidification (SLS) method;
    patterning the polysilicon layer to form a polysilicon active layer;
    performing a rapid thermal annealing (RTA) process to the polysilicon active layer under a $H_2$ atmosphere;
    performing a rapid thermal oxidation (RTO) process to form a silicon-oxidized layer on the polysilicon active layer after the RTA process; and
    forming a metal layer over the transparent substrate to cover the silicon-oxidized layer.

2. A method of forming a thin film transistor, comprising:
    forming a buffer layer on a transparent substrate;
    forming an amorphous silicon layer on the buffer layer;
    crystallizing the amorphous silicon layer into a polysilicon layer using a sequential lateral solidification (SLS) method;
    patterning the polysilicon layer to form a polysilicon active layer;
    performing a rapid thermal annealing (RTA) process to the polysilicon active layer under a $H_2$ atmosphere;
    performing a rapid thermal oxidation (RTO) process to form a silicon-oxidized layer on the polysilicon active layer after the RTA process;
    forming a metal layer over the transparent substrate to cover the silicon-oxidized layer;
    patterning the metal layer to form a gate electrode over the polysilicon active layer;
    doping the polysilicon active layer with impurities using the gate electrode as a doping mask to form ohmic contact regions;
    forming an interlayer insulator over the transparent substrate to cover the gate electrode;
    patterning the interlayer insulator to form first and second contact holes exposing the ohmic contact regions;
    forming source and drain electrodes on the interlayer insulator, the source and drain electrodes contacting the ohmic contact regions, respectively, through the first and second contact holes;
    forming a passivation layer on the interlayer insulator to cover the source and drain electrodes, wherein the passivation layer has a drain contact hole that exposes a portion of the drain electrode; and
    forming a pixel electrode on the passivation layer, the pixel electrode contacting the drain electrode through the drain contact hole.

3. The method according to claim 2, wherein the patterning the metal layer includes patterning the silicon-oxidized layer into the same shape as the gate electrode.

4. The method according to claim 2, wherein the interlayer insulator is formed of one of silicon oxide and silicon nitride.

5. The method according to claim 2, wherein the RTA and RTO processes are conducted at a temperature in the range of about 500 to 1000 degrees Celsius.

6. The method according to claim 2, wherein the RTA and RTO processes are conducted for less than 60 minutes.

7. The method according to claim 2, further comprising dehydrogenating the amorphous silicon layer before crystallizing the amorphous silicon layer.

8. The method according to claim 2, wherein the metal layer is selected from the group consisting of aluminum (Al), aluminum alloy (Al-alloy), and molybdenum (Mo).

9. The method according to claim 2, wherein the RTO process is conducted under an oxygen-based atmosphere.

10. The method according to claim 2, wherein the crystallizing the amorphous silicon layer generates a plurality of protuberances of the polysilicon layer.

11. The method according to claim 9, wherein the oxygen-based atmosphere includes at least one of $O_2$, $N_2O$, and NO.

12. The method according to claim 10, wherein the RTA process blunts and flattens the protuberances of the polysilicon layer.

* * * * *